US006885086B1

(12) United States Patent
Fogelson et al.

(10) Patent No.: US 6,885,086 B1
(45) Date of Patent: Apr. 26, 2005

(54) REDUCED COPPER LEAD FRAME FOR SAW-SINGULATED CHIP PACKAGE

(75) Inventors: Harry J. Fogelson, Tempe, AZ (US); Ludovico E. Bancod, Chandler, AZ (US); Gregorio G. dela Cruz, Laguna (PH); Primitivo A. Palasi, Baguio (PH); William M. Anderson, Gilbert, AZ (US); Ahmer Syed, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 333 days.

(21) Appl. No.: 10/093,267

(22) Filed: Mar. 5, 2002

(51) Int. Cl.$^7$ .............................................. H01L 23/495
(52) U.S. Cl. ...................... 257/666; 257/670; 257/676; 438/111; 438/113
(58) Field of Search ................................ 257/666, 670, 257/676; 438/111, 113, 123

(56) References Cited

U.S. PATENT DOCUMENTS

| | | |
|---|---|---|
| 3,838,984 A | 10/1974 | Crane et al. |
| 4,054,238 A | 10/1977 | Lloyd et al. |
| 4,496,965 A * | 1/1985 | Orcutt et al. ............... 257/666 |
| 4,530,152 A | 7/1985 | Roche et al. |
| 4,707,724 A | 11/1987 | Suzuki et al. |
| 4,756,080 A | 7/1988 | Thorp, Jr. et al. |
| 4,812,896 A | 3/1989 | Rothgery et al. |
| 5,041,902 A | 8/1991 | McShane |
| 5,157,480 A | 10/1992 | McShane et al. |
| 5,172,213 A | 12/1992 | Zimmerman |
| 5,172,214 A | 12/1992 | Casto |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,221,642 A | 6/1993 | Burns |
| 5,258,094 A | 11/1993 | Furui et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,332,864 A | 7/1994 | Liang et al. |
| 5,336,931 A | 8/1994 | Juskey et al. |
| 5,343,076 A | 8/1994 | Katayama et al. |
| 5,406,124 A | 4/1995 | Morita et al. |
| 5,424,576 A | 6/1995 | Djennas et al. |
| 5,435,057 A | 7/1995 | Bindra et al. |

(Continued)

FOREIGN PATENT DOCUMENTS

| | | |
|---|---|---|
| DE | 19734794 A1 | 8/1997 |
| EP | 0794572 A2 | 10/1997 |
| JP | 5745959 | 3/1982 |

(Continued)

*Primary Examiner*—Nitin Parekh
(74) *Attorney, Agent, or Firm*—Stetina Brunda Garred & Brucker (57) ABSTRACT

A lead frame strip for use in the manufacture of integrated circuit chip packages. The strip comprises at least one array defining a multiplicity of lead frames. The lead frames each include an outer frame defining a central opening having a die pad disposed therein. Attached to the outer frame and extending toward the die pad in spaced relation to each other are a plurality of leads. The outer frames are integrally connected to each other such that the lead frames are arranged in a matrix wherein the leads thereof extend in multiple rows and columns. The leads of the lead frames within each of the rows and columns are arranged in sets which are disposed in spaced relation to each other. A plurality of openings are formed within the strip between and in alignment with the leads of each of the lead frames within each of the rows and columns. The leads of each of the lead frames within each of the rows and columns and the openings collectively define saw streets for cutting the strip in a manner separating the lead frames from each other.

20 Claims, 4 Drawing Sheets

U.S. PATENT DOCUMENTS

| | | | |
|---|---|---|---|
| 5,474,958 A | 12/1995 | Djennas et al. |
| 5,521,429 A | 5/1996 | Aono et al. |
| 5,604,376 A | 2/1997 | Hamburgen et al. |
| 5,608,267 A | 3/1997 | Mahulikar et al. |
| 5,639,990 A | 6/1997 | Nishihara et al. |
| 5,640,047 A | 6/1997 | Nakashima |
| 5,641,997 A | 6/1997 | Ohta et al. |
| 5,646,831 A | 7/1997 | Manteghi |
| 5,650,663 A | 7/1997 | Parthasarathi |
| 5,683,806 A | 11/1997 | Sakumoto et al. |
| 5,696,666 A | 12/1997 | Miles et al. |
| 5,701,034 A | 12/1997 | Marrs |
| 5,710,064 A | 1/1998 | Song et al. |
| 5,736,432 A | 4/1998 | Mackessy |
| 5,776,798 A | 7/1998 | Quan et al. |
| 5,783,861 A | 7/1998 | Son |
| 5,835,988 A | 11/1998 | Ishii |
| 5,859,471 A | 1/1999 | Kuraishi et al. |
| 5,866,939 A | 2/1999 | Shin et al. |
| 5,877,043 A | 3/1999 | Alcoe et al. |
| 5,894,108 A | 4/1999 | Mostafazadeh et al. |
| 5,977,613 A | 11/1999 | Takata et al. |
| 5,977,630 A | 11/1999 | Woodworth et al. |
| 5,981,314 A | 11/1999 | Glenn et al. |
| 5,986,885 A | 11/1999 | Wyland |
| 6,001,671 A | 12/1999 | Fjelstad |
| 6,025,640 A | 2/2000 | Yagi et al. |
| 6,034,423 A | 3/2000 | Mostafazadeh et al. |
| 6,072,228 A | 6/2000 | Hinkle et al. |
| 6,130,115 A | 10/2000 | Okumura et al. |
| 6,130,473 A | 10/2000 | Mostafazadeh et al. |
| 6,140,154 A | 10/2000 | Hinkle et al. |
| 6,143,981 A | 11/2000 | Glenn |
| 6,198,171 B1 | 3/2001 | Huang et al. |
| 6,225,146 B1 | 5/2001 | Yamaguchi et al. |
| 6,229,200 B1 | 5/2001 | Mclellan et al. |
| 6,242,281 B1 | 6/2001 | Mclellan et al. |
| 6,281,568 B1 | 8/2001 | Glenn et al. |
| 6,294,100 B1 | 9/2001 | Fan et al. |
| 6,316,821 B1 * | 11/2001 | Chang et al. ............... 257/666 |
| 6,400,004 B1 * | 6/2002 | Fan et al. ................... 257/666 |
| 2002/0089041 A1 * | 7/2002 | Scherbarth et al. ......... 257/666 |

FOREIGN PATENT DOCUMENTS

| | | |
|---|---|---|
| JP | 59227143 | 12/1984 |
| JP | 60195957 | 10/1985 |
| JP | 6139555 | 2/1986 |
| JP | 629639 | 1/1987 |
| JP | 63205935 | 8/1988 |
| JP | 63233555 | 9/1988 |
| JP | 1106456 | 4/1989 |
| JP | 692076 | 4/1994 |
| JP | 7312405 | 11/1995 |
| JP | 8125066 | 5/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| KR | 941979 | 1/1994 |
| KR | 9772358 | 11/1997 |

* cited by examiner

REDUCED COPPER LEAD FRAME FOR SAW-SINGULATED CHIP PACKAGE

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

The present invention relates generally to integrated circuit chip package technology, and more particularly to a unique lead frame design for a micro lead frame (MLF) package adapted to improve the longevity of the cutting blades used in a saw isolation and/or saw singulation process employed during the manufacture of the MLF package.

Integrated circuit dies are conventionally enclosed in plastic packages that provide protection from hostile environments and enable electrical interconnection between the integrated circuit die and an underlying substrate such as a printed circuit board (PCB). The elements of such a package include a metal lead frame, an integrated circuit die, bonding material to attach the integrated circuit die to the lead frame, bond wires which electrically connect pads on the integrated circuit die to individual leads of the lead frame, and a hard plastic encapsulant material which covers the other components and forms the exterior of the package.

The lead frame is the central supporting structure of such a package. A portion of the lead frame is internal to the package, i.e., completely surrounded by the plastic encapsulant. Portions of the leads of the lead frame extend externally from the package or are partially exposed within the encapsulant material for use in electrically connecting the chip package to another component. In certain chip packages, a portion of the die pad of the lead frame also remains exposed within the exterior of the package for use as a heat sink.

For purposes of high-volume, low-cost production of chip packages, a current industry practice is to etch or stamp a thin sheet of metal material to form a panel or strip which defines multiple lead frames. A single strip may be formed to include multiple arrays, with each such array including a multiplicity of lead frames in a particular pattern. In a typical chip package manufacturing process, the integrated circuit dies are mounted and wire bonded to respective ones of the lead frames, with the encapsulant material then being applied to the strip so as to encapsulate the integrated circuit dies, bond wires, and portions of each of the lead frames in the above-described manner.

Upon the hardening of the encapsulant material, the lead frames within the strip are cut apart or singulated for purposes of producing the individual chip packages. Such singulation is typically accomplished via a saw singulation process. In this process, a saw blade is advanced along "saw streets" which extend in prescribed patterns between the lead frames as required to facilitate the separation of the lead frames from each other in the required manner.

One of the drawbacks associated with current, conventional lead frame design and, hence, the configuration of the strips defining multiple such lead frames is that the saw blade used in the saw singulation process cuts through copper (i.e., the metal material typically used to fabricate the strip) approximately ninety percent of the time. As will be recognized, this level of sawing through copper as occurs as a result of the configuration of the strip often results in the premature wear of the costly saw singulation blades. The present invention addresses this drawback by providing a unique lead frame design for an MLF package which is adapted to improve the longevity of the cutting blades used in the saw singulation process involved in the manufacture of the MLF package. More particularly, in the present invention, the amount of copper included in the lead frames and, hence, the strip is reduced, particularly in the cutting areas. The copper reduction is designed in, and facilitated during the etching process employed during the manufacture of the strip. The configuration of the lead frame and thus the strip effectively reduces blade contact with copper by approximately eighty percent, thus providing a substantial cost benefit by reducing premature blade wear and providing a lower cost MLF package. These, and other advantages of the present invention, will be discussed in more detail below.

BRIEF SUMMARY OF THE INVENTION

In accordance with the present invention, there is provided a reduced copper lead frame design for an integrated circuit chip package which improves the longevity of the cutting blades used in a saw singulation process involved in the manufacture of the chip package. In this regard, the reduced copper of the lead frame allows for the fabrication of a strip used for the high volume production of the chip packages with minimal copper and various openings which substantially lessen the amount of copper (or other metal material) cut by the saw blades during the saw singulation process.

The strip of the present invention comprises multiple arrays, each of which defines a multiplicity of lead frames. Each of the lead frames includes an outer frame defining a central opening including a die pad disposed therein. Attached to the outer frame and extending within the opening toward the die pad are a plurality of leads. The leads of each of the lead frames within the array extend in spaced relation to each other. The outer frames are integrally connected to each other such that the lead frames are arranged in a matrix wherein the leads thereof extend in multiple rows and columns. The leads of the lead frames within each of the rows and columns are arranged in sets which are disposed in spaced relation to each other. Formed within the strip between and in alignment with the leads of each of the lead frames within each of the rows and columns are a plurality of openings. The leads of each of the lead frames within each of the rows and columns and the openings collectively define saw streets for cutting the strip in a manner separating the lead frames and hence the chip packages from each other.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
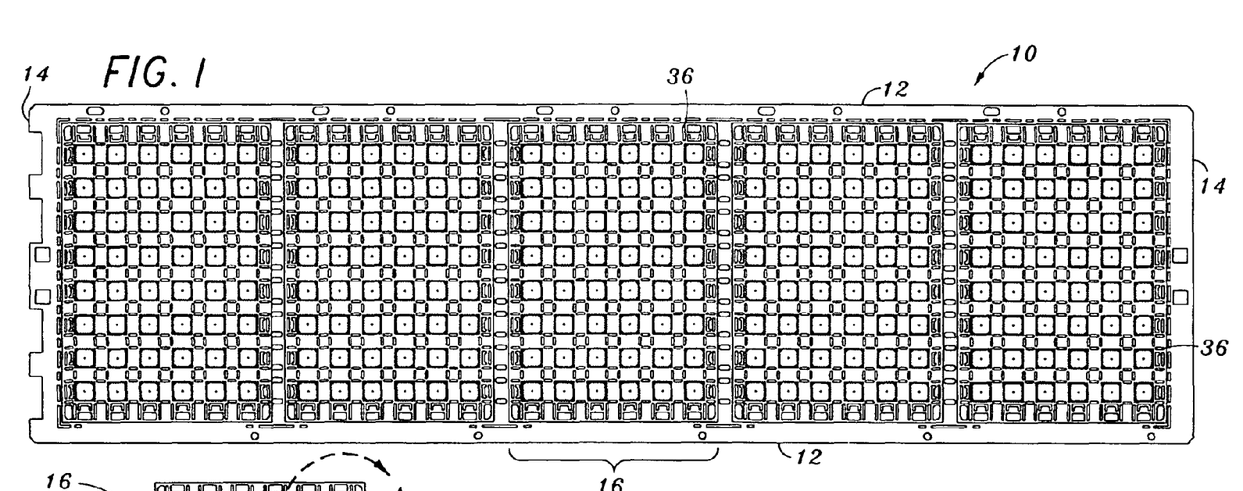
FIG. 1 is a top plan view of a lead frame strip defining multiple lead frames formed in accordance with the present invention.

Referring now to the drawings wherein the showings are for purposes of illustrating preferred embodiments of the present invention only, and not for purposes of limiting the same, FIG. 1 depicts a lead frame strip 10 constructed in accordance with the present invention. The strip 10 has a generally rectangular configuration, defining an opposed pair of longitudinal peripheral edge segments 12 and an opposed pair of lateral peripheral edge segments 14. The strip 10 defines multiple identically configured arrays 16, with one such array 16 being shown in FIG. 2. Each array 16 defines a multiplicity of lead frames 18 which are shown in FIGS. 3–6.

Figure 5:
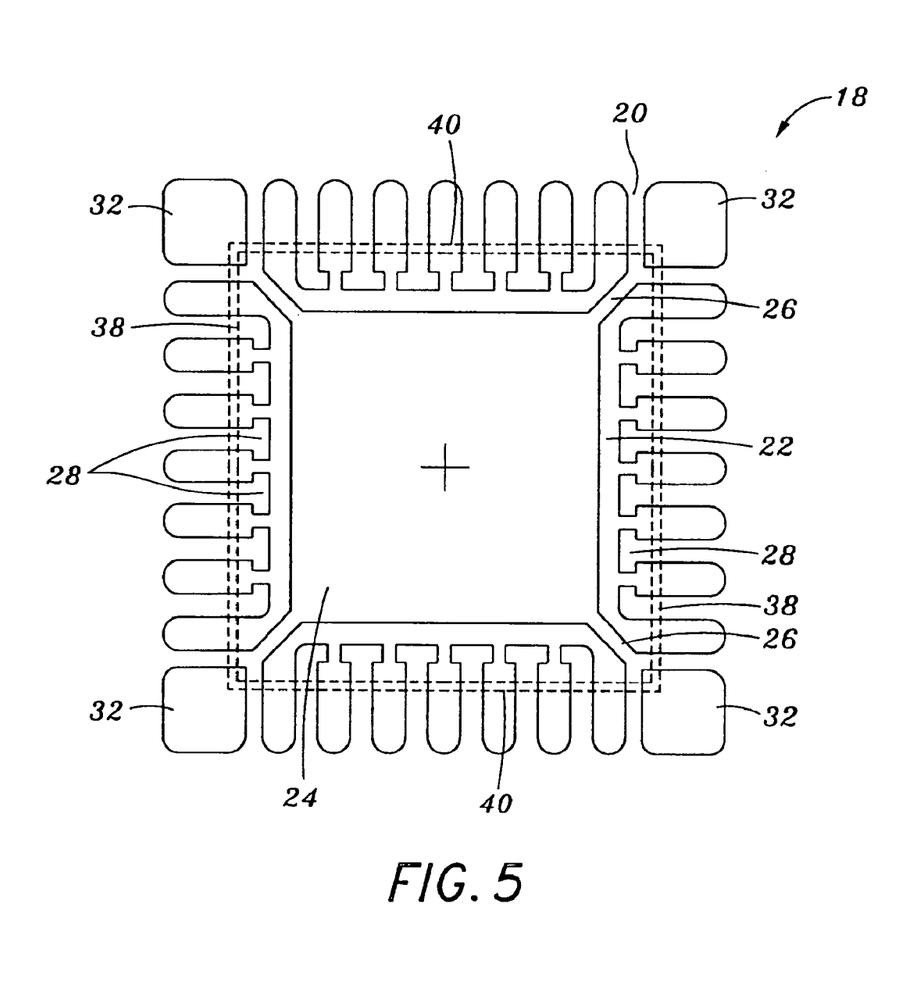
FIG. 5 is an enlargement of one of the lead frames shown in FIG. 4, illustrating the orientation of the saw streets relative thereto.
Figure 6:
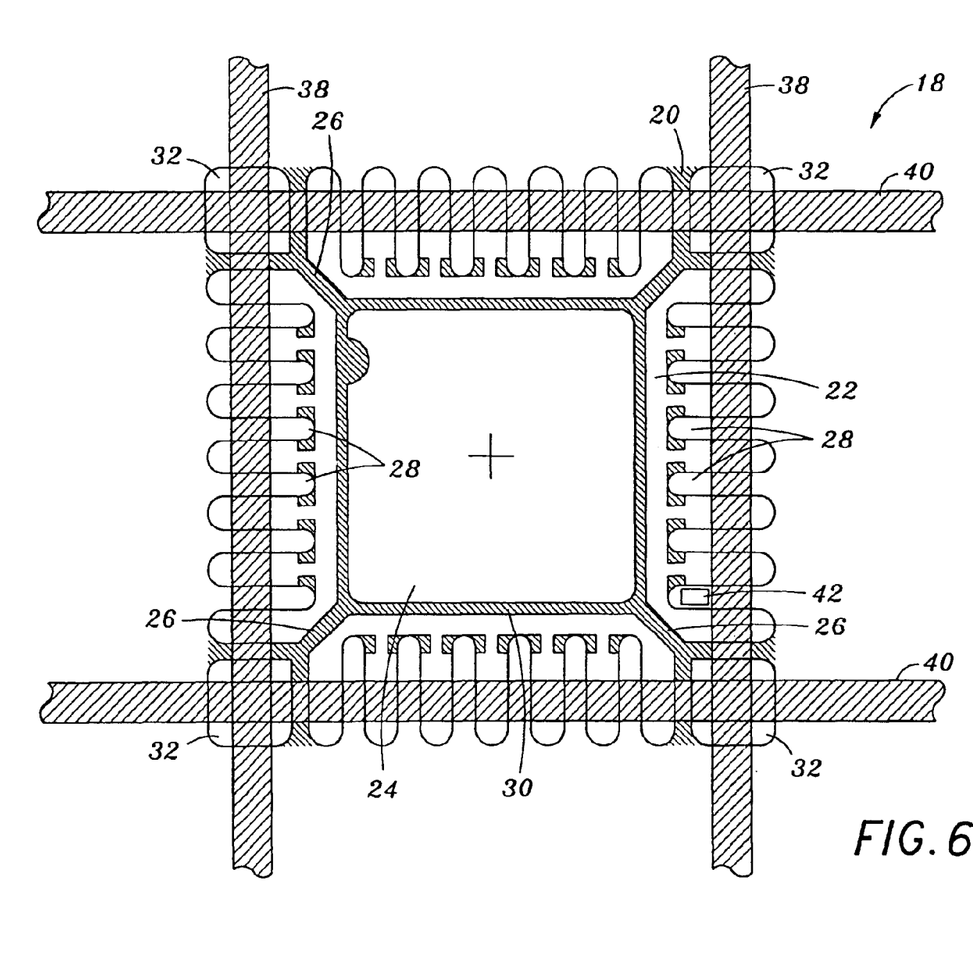
FIG. 6 is a bottom plan view of the lead frame shown in FIG. 5, also illustrating the orientation of the saw streets relative thereto.

Each lead frame 18 comprises an outer frame portion 20 which defines a centrally positioned opening 22. Disposed within the opening 22 is a die pad 24 of the lead frame 18. The die pad 24 is a substantially square plate which is connected to the outer frame portion 20 by a plurality of tie bars 26 of the lead frame 18. As best seen in FIGS. 5 and 6, four tie bars 26 are used to connect the die pad 24 to the outer frame portion 20, with the tie bars 26 extending from respective ones of the four corner regions defined by the die pad 24. The tie bars 26 facilitate the stable support of the die pad 24 inside the outer frame portion 20, and more particularly within the opening 22 defined thereby. The opening 22 itself has a generally square or rectangular configuration, as does the outer frame portion 20.

Each lead frame 18 further comprises a multiplicity of leads 28 which are integrally connected to the outer frame portion 20 and protrude therefrom into the opening 22 toward the peripheral edge of the die pad 24. The leads 28 are segregated into four sets, with each set being disposed in spaced relation to a respective one of the four peripheral edge segments defined by the die pad 24. The leads 28 of each set are also equidistantly spaced from each other, with narrow gaps of equal width being defined therebetween. As indicated above, the free, distal ends of the leads 28 are disposed in spaced relation to the peripheral edge of the die pad 24.

FIG. 5 provides a top view of one of the lead frames 18, with a bottom view being provided in FIG. 6. As shown in FIG. 6, the lead frame 18 is not fabricated to be of uniform thickness. In this regard, the regions of the die pad 24, tie bars 26 and leads 28 represented as deviant lines in FIG. 6 have a thinner thickness than that of the remainder of the lead frame 18. More particularly, the die pad 24 is preferably formed in a manner wherein a recessed shelf 30 extends about the periphery of the bottom surface of the die pad 24, with each of the leads 28 including an enlarged region of reduced thickness formed at the distal end thereof. Those of ordinary skill in the art will recognize that the configuration of the lead frame 18 is exemplary only, and that the present invention contemplates that each lead frame 18 may be formed to be of uniform thickness, or with differing numbers of leads 28 in differing patterns, differing numbers of tie bars 26, or no tie bars 26 at all. However, a common attribute of any lead frame 18 formed in accordance with the present invention is that the same will be configured to employ the use of the least amount of conductive metal material (e.g., copper) as will be discussed in more detail below.

Figure 2:
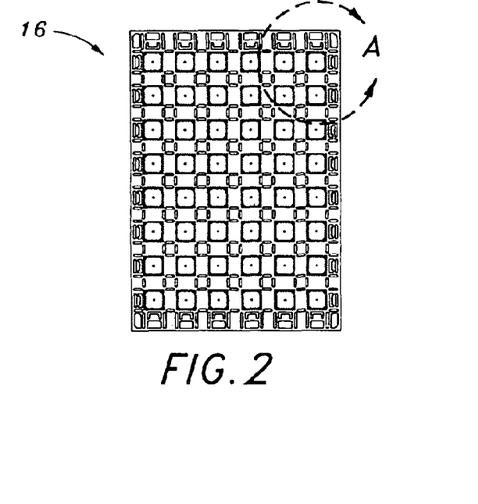
FIG. 2 is a top plan view of one of the lead frame arrays of the strip shown in FIG. 1.
Figure 3:
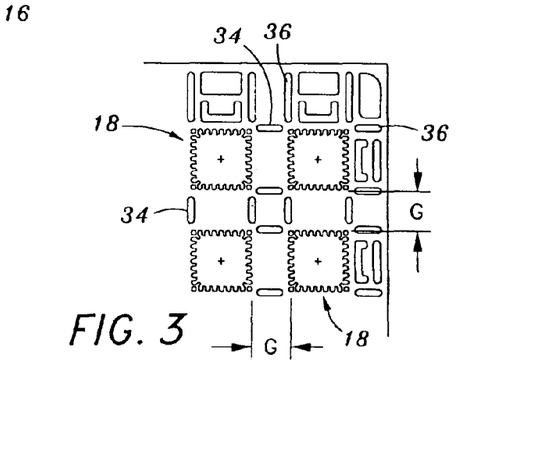
FIG. 3 is an enlargement of the encircled region A shown in FIG. 2.

As indicated above, each array 16 of the strip 10 defines a multiplicity of lead frames 18. In each array 16, the outer frame portions 20 of the lead frames 18 are integrally connected to each other such that the lead frames 18 are arranged in a matrix wherein the leads 28 thereof extend in multiple rows and columns. As shown in FIGS. 1 and 2, each array includes multiple lead frames 18 arranged in a matrix. The sets of the leads 28 within each of the rows and columns are disposed in spaced relation to each other and separated by gaps G. The preferred width of each gap G is in the range of from about 2.8 to about 3.2 millimeters. As previously indicated, each set of leads 28 is defined by those leads 28 of each lead frame 18 extending along a respective one of the peripheral edge segments of the corresponding die pad 24.

The strip 10 further includes a plurality of openings formed therein within each array 16 thereof. These openings are formed within the strip 10 between and in alignment with the leads 28 of each of the lead frames 18 within each of the rows and columns. More particularly, the openings comprise generally square voids 32 which are formed in the strip 10 at each of the four corner regions defined by each of the lead frames 18. In addition to the voids 32, the openings include elongate, rectangularly configured slots 34 which are aligned with and extend between respective pairs of the voids 32. Each of the slots 34 has a preferred length L of approximately 1.48 millimeters. The preferred length and width dimensions of each void 32 is approximately 0.76 millimeters. Thus, two voids 32 and a slot 34 extend between and are aligned with each adjacent set of leads 28 within each row and column. The slot 34 extends between the voids 32 of the corresponding pair within the gap G defined between an adjacent set of leads 28 in each row and column.

Figure 4:
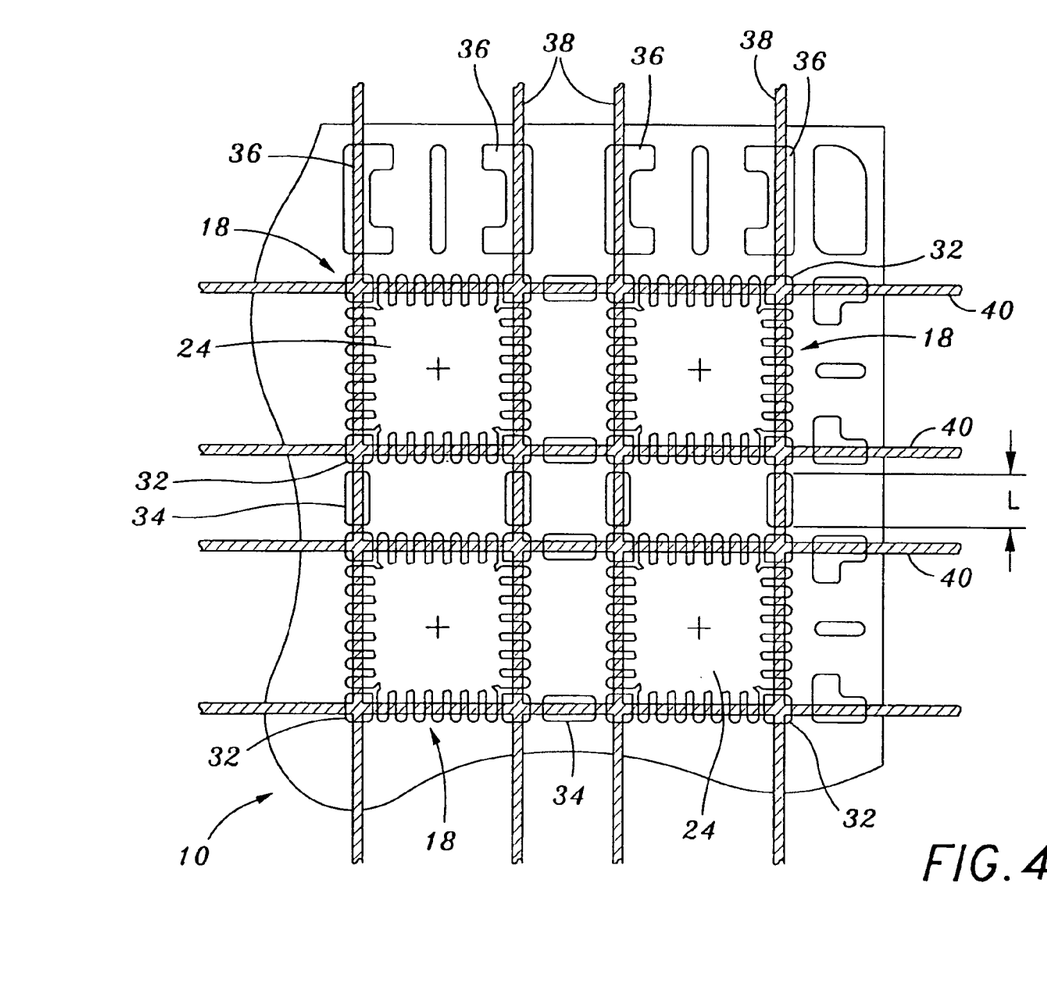
FIG. 4 is an enlargement of FIG. 3, further illustrating the saw streets extending between the lead frames within the array.

As further seen in FIGS. 1–4, the openings formed within the strip 10 may further comprise elongate slots 36 which are aligned with and extend between respective sets of the leads 28 of the outermost lead frames 18 within each of the rows and columns, and respective ones of the longitudinal and lateral peripheral edge segments 12, 14 of the strip 10. As seen in FIGS. 4–6, the leads 28 of each of the lead frames 18 within each of the rows and columns, the voids 32, and the slots 34, 36 collectively define lateral saw streets 38 which extend perpendicularly between the longitudinal peripheral edge segments 12 of the strip 10, and longitudinal saw streets 40 which extend perpendicularly between the lateral peripheral edge segments 14 of the strip 10. The lateral saw streets 38 are partially defined by respective columns of the leads 28, with the longitudinal saw streets 40 being partially defined by respective rows of the leads 28. In the manufacture of integrated circuit chip packages from the lead frame strip 10, the passage of a cutting blade along the lateral and longitudinal saw streets 38, 40 separates the lead frames 18 from each other.

The strip 10 preferably comprises a first layer which is formed from an insulating material (e.g., a molding compound), and a second layer which is formed from a conductive metallic material (e.g., copper) and defines the lead frames 18, voids 32, and slots 34, 36. The second layer of the lead strip is preferably formed by chemical etching, with the regions of the lead frames 18 of reduced thickness being formed through the implementation of a half-etch technique. The second layer is applied to the first layer such that the first layer covers one side of each of the lead frames 18 and the openings within the strip 10. During the saw singulation process used to separate the lead frames 18 from each other, the saw blade cutting along the lateral and longitudinal saw streets 38, 40 is required to cut only a minimal amount of metal material. The metal material included in each of the lateral and longitudinal saw streets 38, 40 includes only each of the leads 28, segments of the outer frame portions 20 extending between the leads 28 and voids 32, segments of the outer frame portions 20 between the voids 32 and slots 34, and segments of the outer frame portions 20 between the voids 32 and slots 36. As will be recognized, when the saw blade is passing between the leads 28, through the voids 32 or through the slots 34, 36, the same is not cutting metal material. Rather, the saw blade is cutting only the insulating material of the first layer which is non-metal and actually dresses the saw blade. Thus, the reduced copper content of the lead frames 18 and resultant configuration of the strip 10 effectively reduces contact between the saw blade and the metal material of the second layer of the strip 10 by approximately eighty percent, which constitutes a significant departure from prior art strips wherein the saw blade is required to cut through metal material approximately ninety percent of the time. As will be recognized, the substantial reduction of contact between the saw blade and metal material in the strip 10 provides a substantial cost benefit by reducing premature blade wear, thus providing a lower cost integrated circuit chip package.

Further in accordance with the present invention, it is contemplated that the leads 28 of each of the lead frames 18 may have a solder bump 42 formed thereon prior to any saw singulation of the strip 10 along the lateral and longitudinal saw streets 38, 40. An exemplary solder bump 42 formed on the distal portion of one of the leads 28 is shown in FIG. 6. If the solder bumps 42 are to be preformed on each of the leads 28, the singulation of the strip 10 to separate the lead frames 18 from each other and thus complete the fabrication of the chip packages will occur in a two-step process. In the first step, an "iso cut" will be completed along the lateral and longitudinal saw streets 38, 40. As a result of this initial cut, the conductive metal material (e.g., copper) of the second layer is removed along the lateral and longitudinal saw streets 38, 40, with the insulating material of the first layer being left intact. Upon the completion of the iso cut, the solder bumps 42 are applied to the leads 28 of each of the lead frames 18. Thereafter, a second cut is completed along the lateral and longitudinal saw streets 38, 40 by a saw blade which is thinner than the saw blade used to complete the iso cut. As will be recognized, in the second, follow-up sawing process, the saw blade cuts only through the first layer due to the removal of the second layer as a result of the iso cut. The use of a thinner blade for completing the second cut prevents any burring or smearing of the solder bumps 42 which could extend to the lateral and longitudinal saw streets 38, 40. The completion of the second cut completes the saw singulation of the strip 10 and complete separation of the lead frames 18 from each other.

The leads 28 of the lead frames 18 may each be provided with the solder bump 42 without necessarily completing the saw singulation of the strip 10 in the above-described two-step process involving the initial iso cut. In this regard, the solder bumps 42 could simply be formed on each of the leads 28, with a single cut thereafter being completed along the lateral and longitudinal saw streets 38, 40 in the aforementioned manner wherein the first and second layers of the strip 10 are cut at the same time. However, if the solder bumps 42 are to be formed on the leads 28 prior to this single cut, such solder bumps 42 must be carefully positioned on the distal portions of the leads 28 so that the saw singulation process does not cause excessive burring or smearing thereof.

This disclosure provides exemplary embodiments of the present invention. The scope of the present invention is not limited by these exemplary embodiments. Numerous variations, wether explicitly provided for by the specification or implied by the specification, such as variations in structure, dimension, type of material and manufacturing process may be implemented by one of skill in the art in view of this disclosure.

What is claimed is:

1. A lead frame strip for use in the manufacture of integrated circuit chip packages, the strip comprising:
    at least one array defining a multiplicity of lead frames which each include:
    an outer frame defining a central opening;
    a die pad disposed within the central opening; and
    a plurality of leads attached to the outer frame and extending toward the die pad in spaced relation to each other;
    the outer frames being integrally connected to each other such that the lead frames are arranged in a matrix wherein the leads thereof extend in multiple rows and columns, the leads within each of the rows and columns being arranged in sets which are disposed in spaced relation to each other and separated by prescribed gaps;
    a plurality of openings formed within the strip between and in alignment with at least some of the sets of the leads within at least some of the rows and columns, at least some adjacent sets of the leads being separated from each other by at least one of the openings which is sized to span a corresponding one of the gaps;
    the sets of the leads within each of the rows and columns and the openings collectively defining saw streets for cutting the strip in a manner separating the lead frames from each other.

2. The lead frame strip of claim 1 wherein the openings are formed within the strip between and in alignment with all of the sets of the leads within each of the rows and columns.

3. The lead frame strip of claim 1 wherein the strip includes five arrays.

4. The lead frame strip of claim 1 wherein the strip comprises:
    a first layer formed from an insulating material; and
    a second layer formed from a conductive material and defining the lead frames and the openings;
    the second layer being applied to the first layer such that the first layer covers one side of each of the lead frames and the openings.

5. A lead frame strip for use in the manufacture of integrated circuit chip packages, the strip comprising:
    at least one array defining a multiplicity of lead frames which each include:
    an outer frame defining a central opening;
    a die pad disposed within the central opening; and
    a plurality of leads attached to the outer frame and extending toward the die pad in spaced relation to each other;
    the outer frames being integrally connected to each other such that the lead frames are arranged in a matrix wherein the leads thereof extend in multiple rows and columns, the leads within each of the rows and columns being arranged in sets which are disposed in spaced relation to each other;

at least three openings formed within the strip between and in alignment with each adjacent pair of the sets of the leads within each of the rows and columns;

the sets of the leads within each of the rows and columns and the openings collectively defining saw streets for cutting the strip in a manner separating the lead frames from each other.

6. The lead frame strip of claim 5 wherein:

the outer frame of each of the lead frames is generally square and defines four corner regions; and the openings comprise:
generally square voids formed in each of the corner regions of each of the outer frames; and
generally rectangular slots aligned with and extending between respective pairs of the voids.

7. The lead frame strip of claim 6 wherein:

the strip has a generally rectangular configuration defining opposed pairs of longitudinal and lateral peripheral edge segments; and the openings further comprise generally rectangular slots aligned with and extending between the leads of outermost ones of the sets within each of the rows and columns and respective ones of the longitudinal and lateral peripheral edge segments.

8. A lead frame strip for use in the manufacture of integrated circuit chip packages, the strip comprising:

at least one array defining a multiplicity of lead frames which each include a plurality of leads extending in spaced relation to each other, the lead frames being arranged in a matrix wherein the leads thereof extend in multiple rows and columns, and the leads within each of the rows and columns are arranged in sets which are disposed in spaced relation to each other and separated by prescribed gaps; and a plurality of openings formed within the strip between and in alignment with at least some of the sets of the leads within at least some of the rows and columns, at least some adjacent sets of the leads being separated from each other by at least one of the openings which is sized to span a corresponding one of the gaps;

the sets of the leads within each of the rows and columns and the openings collectively defining saw streets for cutting the strip in a manner separating the lead frames from each other.

9. The lead frame strip of claim 8 wherein the openings are formed within the strip between and in alignment with all of the sets of the leads within each of the rows and columns.

10. The lead frame strip of claim 8 wherein the strip includes five arrays.

11. The lead frame strip of claim 8 wherein the strip comprises:

a first layer formed from an insulating material; and a second layer formed from a conductive material and defining the lead frames and the openings;

the second layer being applied to the first layer such that the first layer covers one side of each of the lead frames and the openings.

12. A lead frame strip for use in the manufacture of integrated circuit chip packages, the strip comprising:

at least one array defining a multiplicity of lead frames which each include a plurality of leads extending in spaced relation to each other, the lead frames being arranged in a matrix wherein the leads thereof extend in multiple rows and columns, and the leads within each of the rows and columns are arranged in sets which are disposed in spaced relation to each other; and at least three openings formed within the strip between and in alignment with each adjacent pair of the sets of the leads within each of the rows and columns;

the sets of the leads within each of the rows and columns and the openings collectively defining saw streets for cutting the strip in a manner separating the lead frames from each other.

13. The lead frame strip of claim 12 wherein:

each of the lead frames is generally square and defines four corner regions; and the openings comprise:
generally square voids formed in each of the corner regions; and
generally rectangular slots aligned with and extending between respective pairs of the voids.

14. The lead frame strip of claim 13 wherein:

the strip has a generally rectangular configuration defining opposed pairs of longitudinal and lateral peripheral edge segments; and the openings further comprise generally rectangular slots aligned with and extending between the leads of outermost ones of the sets within each of the rows and columns and respective ones of the longitudinal and lateral peripheral edge segments.

15. A lead frame strip for use in the manufacture of integrated circuit chip packages, the strip comprising:

a multiplicity of lead frames which each include a plurality of leads extending in spaced relation to each other, the lead frames being arranged such that the leads thereof extend in multiple rows and columns, and the leads within each of the rows and columns are arranged in sets which are disposed in spaced relation to each other and separated by prescribed gaps; and a plurality of openings formed within the strip between and in alignment with at least some of the sets of the leads within at least some of the rows and columns, at least some adjacent sets of the leads being separated from each other by at least one of the openings which is sized to span a corresponding one of the gaps;

the sets of the leads within each of the rows and columns and the openings collectively defining saw streets for cutting the strip in a manner separating the lead frames from each other.

16. The lead frame strip of claim 15 wherein the openings are formed within the strip between and in alignment with all of the sets of the leads within each of the rows and columns.

17. The lead frame strip of claim 15 wherein the strip comprises:

a first layer formed from an insulating material; and a second layer formed from a conductive material and defining the lead frames and the openings;

the second layer being applied to the first layer such that the first layer covers one side of each of the lead frames and the openings.

18. A lead frame strip for use in the manufacture of integrated circuit chip packages, the strip comprising:

a multiplicity of lead frames which each include a plurality of leads extending in spaced relation to each other, the lead frames being arranged such that the leads thereof extend in multiple rows and columns, and the leads within each of the rows and columns are arranged in sets which are disposed in spaced relation to each other; and at least three openings formed within the strip between and in alignment with each adjacent pair of the sets of the leads within each of the rows and columns;

the sets of the leads within each of the rows and columns and the openings collectively defining saw streets for cutting the strip in a manner separating the lead frames from each other.

19. The lead frame strip of claim 18 wherein:

each of the lead frames is generally square and defines four corner regions; and the openings comprise:

generally square voids formed in each of the corner regions; and generally rectangular slots aligned with and extending between respective pairs of the voids.

20. The lead frame strip of claim 19 wherein:

the strip has a generally rectangular configuration defining opposed pairs of longitudinal and lateral peripheral edge segments; and the openings further comprise generally rectangular slots aligned with and extending between the leads of outermost ones of the sets within each of the rows and columns and respective ones of the longitudinal and lateral peripheral edge segments.

\* \* \* \* \*